United States Patent
Vihriälä

(10) Patent No.: US 6,956,895 B2
(45) Date of Patent: Oct. 18, 2005

(54) METHOD AND ARRANGEMENT FOR REDUCING FREQUENCY OFFSET IN A RADIO RECEIVER

(75) Inventor: Jaakko Vihriälä, Oulu (FI)

(73) Assignee: Nokia Mobile Phones Ltd., Espoo (FI)

( * ) Notice: Subject to any disclaimer, the term of this patent is extended or adjusted under 35 U.S.C. 154(b) by 706 days.

(21) Appl. No.: 09/864,984

(22) Filed: May 24, 2001

(65) Prior Publication Data

US 2002/0045433 A1 Apr. 18, 2002

(30) Foreign Application Priority Data

May 30, 2000 (FI) .............................. 20001289

(51) Int. Cl.[7] .............................. H04B 1/69; H04B 1/26
(52) U.S. Cl. ...................................... 375/148; 455/313
(58) Field of Search ............................... 375/147–150; 370/342; 455/296–313

(56) References Cited

U.S. PATENT DOCUMENTS

| | | | | |
|---|---|---|---|---|
| 5,361,276 A | * | 11/1994 | Subramanian | 375/150 |
| 5,638,362 A | * | 6/1997 | Dohi et al. | 370/342 |
| 5,809,084 A | * | 9/1998 | Shida et al. | 375/318 |
| 5,909,462 A | * | 6/1999 | Kamerman et al. | 375/147 |
| 6,363,102 B1 | * | 3/2002 | Ling et al. | 375/147 |
| 6,373,861 B1 | * | 4/2002 | Lee | 370/503 |
| 6,466,566 B1 | * | 10/2002 | De Gaudenzi et al. | 370/342 |

FOREIGN PATENT DOCUMENTS

EP     0 923 199 A2     6/1999

OTHER PUBLICATIONS

"A Novel Pilot Symbol Assisted Coherent Detection Scheme For Rician Fading Channels", Asahara et al., WPMC'98.

* cited by examiner

Primary Examiner—Amanda T. Le
Assistant Examiner—Cicely Ware
(74) Attorney, Agent, or Firm—Perman & Green, LLP

(57) ABSTRACT

The invention concerns generally the technology of reducing frequency offset in a radio receiver. Especially the invention concerns receivers where a channel estimator is used for correcting the base band signal. The objects of the invention are achieved by monitoring the phase of the channel estimation output and generating a complex phasor on the basis of successive phase values. The received baseband signal is then multiplied by the generated complex phasor for compensating the frequency offset. The frequency compensation can be made before or after said channel estimation thus producing a feedback compensation or feed forward compensation. The feedback compensation can be implemented by compensating the baseband signal either prior to the despreading or after the despreading.

26 Claims, 7 Drawing Sheets

METHOD AND ARRANGEMENT FOR REDUCING FREQUENCY OFFSET IN A RADIO RECEIVER

TECHNICAL FIELD OF THE INVENTION

The invention relates generally to the technology of reducing frequency offset in a radio receiver. Especially the invention concerns receivers where a channel estimator is used for correcting the signal e.g. due to the multipath transmission. The invention is preferably applied in receivers of mobile communication systems, especially in systems that are based on CDMA (Code Division Multiple Access).

BACKGROUND ART OF THE INVENTION

A received radio signal has often been corrupted by noise and intersymbol interference caused by e.g. multipath propagation. The multipath propagation may be e.g. of a Rician type where there is one (direct) path with a strong received signal, and other (reflected) paths with smaller signal strength. The Rician type propagation is usual in satellite systems. Another type of multipath propagation is a Rayleigh fading channel, where the strength of the received signals from different paths are of the similar magnitude. The Rayleigh fading channels are typical in cellular communications systems with fixed base stations.

A functional block known as the signal equalizer is often used in TDMA (Time Divisional Multiple Access) receivers for recovering transmitted data from a received signal. In CDMA receivers a rake receiver is used performing this function. Typical radio receivers that use signal equalizers and Rake receivers are mobile stations and base stations of cellular radio systems. A signal equalizer needs to know the impulse response of the radio channel for the equalization to be successful. The conventional way of performing channel estimation and signal equalization is to generate an estimate of the radio channel's impulse response (also known as the channel estimate for short), and to equalize the received transmission blocks by using the achieved equalization data. A rake receiver typically comprises a channel estimator for each rake finger for estimating a complex channel multiplier for each signal path to be corrected. An example of a prior art solution for providing one rake finger in a WCDMA (Wideband Code Division Multiple Access) rake receiver is shown in FIG. 1.

FIG. 1 illustrates a prior art receiver arrangement for receiving a CDMA signal. An analog oscillating signal on a radio frequency is received through an antenna 102, downconverted onto a complex baseband frequency signal in a radio receiver 104 and converted into a series of digital samples in an AID converter 106. In the present CDMA receiver the despreading of the signal is performed by first leading the samples to a multiplier 110 for multiplying the received samples by a complex conjugate of the long code (also called a "scrambling code" in WCDMA). The signal from the multiplier 110 is led to another multiplier 120 for multiplying the signal with a short code. The achieved, despread signal is then integrated in block 122.

The signal from the multiplier 110 is also led to an integrator 112 and further to a channel estimator 114. The channel estimator estimates the complex channel coefficient of the radiochannel using pilot signal information (or a training sequence in a TDMA receiver), and provides the channel estimate for removing the channel. The despread signal from the integrator 122 is then multiplied by the complex conjugate of the channel estimator output in order to remove the phase shift caused by the channel. The output includes the recovered data (the so-called hard decision output) and it may include reliability information (soft decision output) associated with the recovered data.

The output is further transformed into a real signal in block 132. The channel decoding operation may comprise additional operations like de-interleaving, and the reconstructed information symbols may be conveyed further e.g. to an audio or video decoder, to a data storage device or to some control circuitry.

An article [1] "A Novel Pilot Symbol Assisted Coherent Detection Scheme for Rician Fading Channels" by T. Asahara, T. Kojima and M. Miyake, WPMC '98, pp. 236–239, 1998, presents an advanced prior art method for equalizing a radio channel. The method is developed for receivers in a satellite communication system, where the channels are of Rician type.

With the prior art channel equalization of [1] and FIG. 1 it is possible to compensate phase shifts that are present in the received signals due to the multipath radio channel characteristics. However, the prior art arrangements of [1] and FIG. 1 are not able to sufficiently correct frequency offsets that may exist. And even if the prior arrangements are able to correct some of the frequency offset, the frequency offset still makes the channel estimates less accurate which causes losses in performance.

There are two main causes for frequency errors or "frequency offsets". The first one is a frequency offset in the receiver oscillator which is used for downconverting the received RF signal. This means that there is a frequency offset between receiver oscillator frequency and the carrier frequency of the base station. This offset, for example, degrades the performance of the channel estimator.

Another cause for a rotation of the signal constellation is a so-called doppler effect. This means that the length of the radio signal path between the mobile station and the base station changes when the mobile station moves. This causes a doppler spectrum in a received signal. Since a mobile station adjusts its transmission frequency according to the received carrier there will be a frequency error due to the doppler effect in the received signal. Especially with high mobile speeds the residual doppler effect can be large and this will also degrade the performance of a channel estimator.

In mobile station receivers the frequency offset may be detected and frequency of the local oscillator (RF oscillator or IF oscillator) signal can be controlled to remove the offset. However, in the prior art receivers there is no information available on the exact amount of the frequency offset. Another problem is that the resolution of the oscillator frequency adjustment is usually too coarse for adequately compensating the frequency offset. In base station receivers it is not possible to adjust the local oscillator frequency, because the local oscillators are common for several channels, and the amount of doppler effect is usually different for signals that are received from different mobile stations. It would also be possible to use adaptive channel equalizers for compensating the frequency offset, but these kind of equalizers require large amounts of memory and processing capacity, and therefore they would substantially increase the manufacturing costs of the receivers.

SUMMARY OF THE INVENTION

It is an object of the invention to provide a method and an arrangement for enhancing the performance of a radio receiver by reducing the frequency offset. It is an additional object of the invention to provide a method and an arrangement which would not add much to the complexity of the receiver.

The objects of the invention are achieved by monitoring the phase of the channel estimation output and generating a complex phasor on the basis of successive phase values. The received baseband signal is then multiplied by the generated complex phasor for compensating the frequency offset. The frequency compensation can be made before or after said channel estimation thus producing a feedback compensation or feedforward compensation. In case of receiving a spread spectrum signal the feedback compensation can be implemented by compensating the baseband signal either prior to the despreading or after the despreading. In case of a rake receiver the frequency offset can be estimated from several channel estimates.

The advantage of the feedback compensation is its simple structure. However, it is generally not possible to compensate RACH (Random Access CHannel) bursts with feedback compensation, because of long settling times of the feedback loop. The advantage of the feedforward compensation is that it does not have settling delays for achieving an accurate frequency compensation, and therefore compensation of RACH bursts is also possible.

The inventive solution has important advantages over the prior art solutions. Firstly, the frequency offset can be compensated very efficiently, ie. it is possible to achieve a very small residual frequency offset. The present invention can be used in base stations where conventional local frequency control is not possible. A further advantage of the present invention is that the frequency error can be removed prior to the final channel estimation phase. The compensation of the frequency offset prior to the channel compensation improves the accuracy of the channel estimator and this improves overall performance of the receiver. This effect is especially important, if the channel estimation filter is adaptive, because when the frequency offset is zero in the channel estimator input, the autocorrelation of the channel estimates is real (the doppler spectrum is symmetric). Therefore a part of the calculation processing can be accomplished using real arithmetics. The described advantages can be achieved with small memory and processing capacities.

The principle of the invention is next described referring to FIGS. 2a and 2b.

In the channel, as seen by the baseband receiver, the transmitted signal x(t) is multiplied with c(t) and additive white gaussian noise (AWGN) n(t) is added to it:

$$r(t)=c(t)\cdot x(t)+n(t) \quad (1)$$

In practice, there is also difference in transmitter and receiver carrier oscillator frequencies and therefore the complex envelope of the multiplicative distortion becomes $$c(t)=e^{j2\pi f_e t}+1(t) \quad (2)$$

where g(t) is complex gaussian process having power spectrum, 291–294, depicted in FIG. 2a. Classical Doppler spectrum is assumed in this example, but the shape of the spectrum is not essential to the implementation of the invention. Also a Rayleigh fading channel is assumed in this example, which is more demanding for the receiver than a Rician channel.

Due to the multiplication with a complex phasor the center frequency of the received, downconverted signal is moved by the amount of $f_e$. The spectrum of c(t), 296–299, is illustrated in FIG. 2b. $f_D$ is called (maximum) Doppler frequency and it depends on the mobile speed and is defined as $$f_D = \frac{v f_0}{c} \quad (3)$$

where v is the speed of the mobile, $f_0$ is carrier frequency and c is the speed of light.

The frequency offset is detected from the consecutive filtered complex channel estimates. For example, the phase difference between to consecutive channel estimates is measured in a phase analyzer block and a differentiator after it. In case of a feedback compensation, the estimate is low pass filtered to reduce noise and the result is integrated to form a control variable $\hat{f}_e$. This is then used to form a complex phasor of the form $e^{-j2\pi \hat{f}_e t}$ which is multiplied with the input signal. The correction of the input signal can be performed before or after despreading. As a result the residual frequency error seen by the channel estimation is very small.

If a rake receiver with several rake fingers is used, the frequency error estimates of all fingers can be averaged. In case of feedback compensation the cut-off frequency of the low pass filter can be made low, since the frequency offset $\hat{f}_e$ changes very slowly.

The invention applies to a method for compensating a frequency offset in processing a received radio signal wherein the receiving and the processing comprises the steps of receiving a radio signal having a carrier frequency from a radio channel, producing a local oscillator signal, wherein there is a frequency offset between the carrier frequency of the received radio signal and the frequency of the local oscillator signal.

mixing the received radio signal with the local oscillator signal for producing a baseband signal, converting the baseband signal into digital samples, producing a radio channel estimation data, correcting the phase of the baseband signal on the basis of the channel estimation data, and the invention is characterized in that the method further comprises the steps of:

detecting phases from successive channel estimation data, generating a complex phasor on the basis of said detected phases, and multiplying the baseband signal with said complex phasor for reducing the frequency offset of the baseband signal.

The invention also applies to an arrangement for receiving a radio signal and compensating a frequency offset in processing the received radio signal, wherein the arrangement comprises means for receiving a radio signal having a carrier frequency from a radio channel, means for producing a local oscillator signal, wherein there is a frequency offset between the carrier frequency of the received radio signal and the frequency of the local oscillator signal, means for mixing the received radio signal with the local oscillator signal for producing a baseband signal, means for converting the baseband signal into digital samples, means for producing a radio channel estimation data, means for correcting the phase of the baseband signal on the basis of the channel estimation data, and it is characterized in that the arrangement further comprises:

means for detecting phases from successive channel estimation data, means for generating a complex phasor on the basis of said detected phases, and means for multiplying the baseband signal with said complex phasor for reducing the frequency offset of the baseband signal.

The invention further applies to a mobile station including an arrangement for receiving a radio signal and compensating a frequency offset in processing the received radio signal, wherein the arrangement comprises means for receiving a radio signal having a carrier frequency from a radio channel, means for producing a local oscillator signal, wherein there is a frequency offset between the carrier frequency of the received radio signal and the frequency of the local oscillator signal, means for mixing the received radio signal with the local oscillator signal for producing a baseband signal, means for converting the baseband signal into digital samples, means for producing a radio channel estimation data, means for correcting the phase of the baseband signal on the basis of the channel estimation data, and it is characterized in that the arrangement further comprises:

means for detecting phases from successive channel estimation data, means for generating a complex phasor on the basis of said detected phases, and means for multiplying the baseband signal with said complex phasor for reducing the frequency offset of the baseband signal.

The invention further applies to a base station including an arrangement for receiving a radio signal and compensating a frequency offset in processing the received radio signal, wherein the arrangement comprises:

means for receiving a radio signal having a carrier frequency from a radio channel, means for producing a local oscillator signal, wherein there is a frequency offset between the carrier frequency of the received radio signal and the frequency of the local oscillator signal, means for mixing the received radio signal with the local oscillator signal for producing a baseband signal, means for converting the baseband signal into digital samples, means for producing a radio channel estimation data, means for correcting the phase of the baseband signal on the basis of the channel estimation data, and it is characterized in that the base station further comprises:

means for detecting phases from successive channel estimation data, means for generating a complex phasor on the basis of said detected phases, and means for multiplying the baseband signal with said complex phasor for reducing the frequency offset of the baseband signal.

Preferred embodiments of the invention are described in the dependent claims.

BRIEF DESCRIPTION OF THE DRAWINGS

The invention, both as to its construction and its method of operation, together with additional objects and advantages thereof, will be best understood from the following description of specific embodiments when read in connection with the accompanying drawings in which.

DETAILED DESCRIPTION

Figure 1:
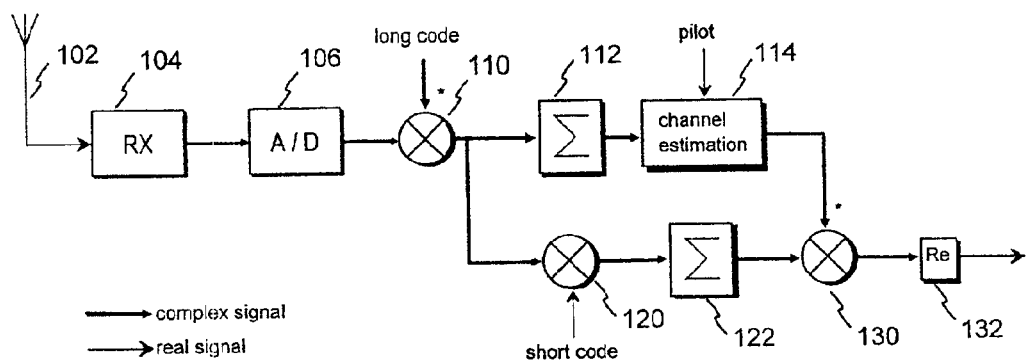
FIG. 1 illustrates a block diagram of a prior art receiving arrangement.
Figure 2A:
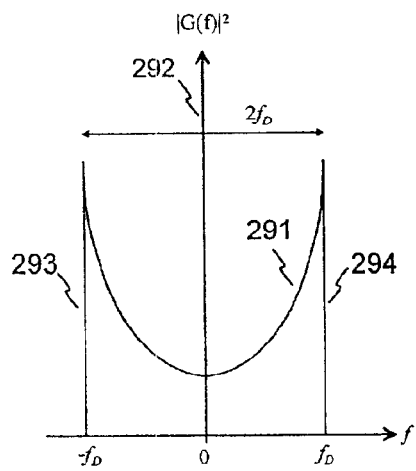
FIG. 2 illustrates the doppler effect of a moving receiver.
Figure 2B:
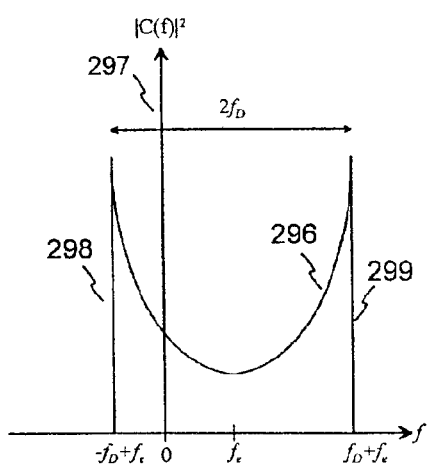

FIGS. 1 and 2 have been described in the previous parts of the specification.

Figure 3:
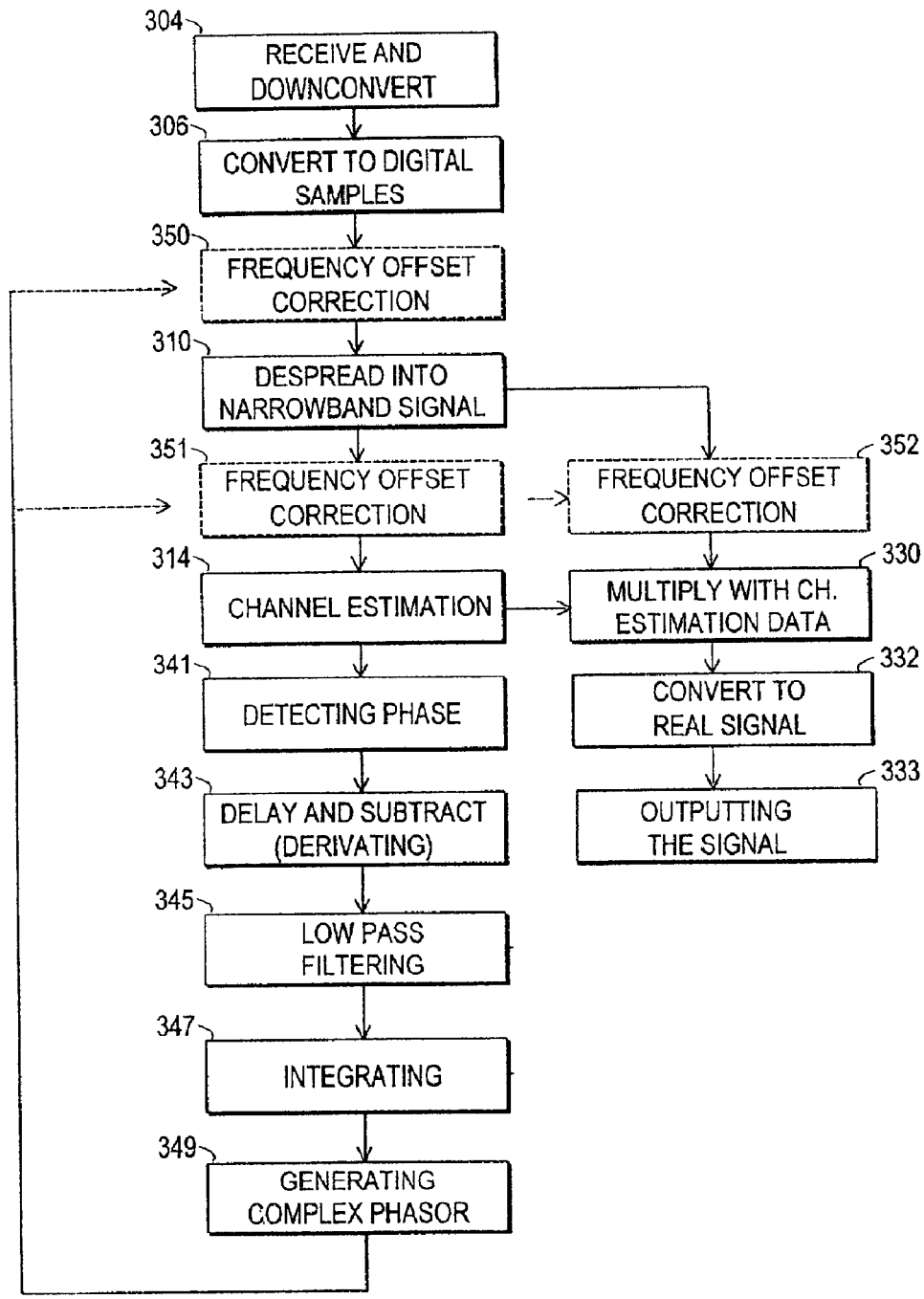
FIG. 3 illustrates a flow diagram of a receiving method according to a first embodiment of the invention.

FIG. 3 illustrates a flow diagram of a receiving method according to a first embodiment of the invention where frequency offset correction is performed with a feedback signal. A received RF signal is first downconverted to the baseband by mixing with a local oscillator (LO) signal, 304, and then converted to digital samples forming a digital baseband signal, 306. If the frequency offset correction is performed to the wideband signal, the signal is then multiplied with a complex phasor in step 350.

The signal is further despread to form a narrowband signal. 310. The despreading is performed with a long code successively with a long code and a short code. If the frequency offset correction is performed to the narrowband signal, then the signal after despreading with a long code is multiplied with the complex phasor in step 351, and the signal which is despread with both the long code and the short code is multiplied with the complex phasor in step 352.

A channel estimate is formed based on the signal which is despread with the long code using the pilot, 314. The channel estimation data is used for performing the channel correction by mixing with the information signal that achieved by despreading with both the long and short codes, 330. The data is then converted into a real signal, 332, and used as an information output signal of the receiver, 333.

The channel estimate data is, according to the present invention, used for forming the frequency offset correction signal. The phase of the channel estimate correction data is first detected. 341. The detected phase data is then derivated by, for example, calculating the difference between two consecutive phases. The derivative signal is then low pass filtered, 345, and the filtered signal is further integrated, 547, in order to form the frequency offset control variable $\hat{f}_e$. A complex phasor is formed on the basis of the control variable, 349. The frequency offset correction is then achieved by multiplying the next sample of the input signal with the complex phasor either before the despreading, 350, or after the despreading, 351.

In the method of FIG. 3 the steps of phases of derivating and low pass filtering may also be performed before the phase detection, which would reduce the number of necessary arctangent calculations in the step of phase detection.

Figure 4:
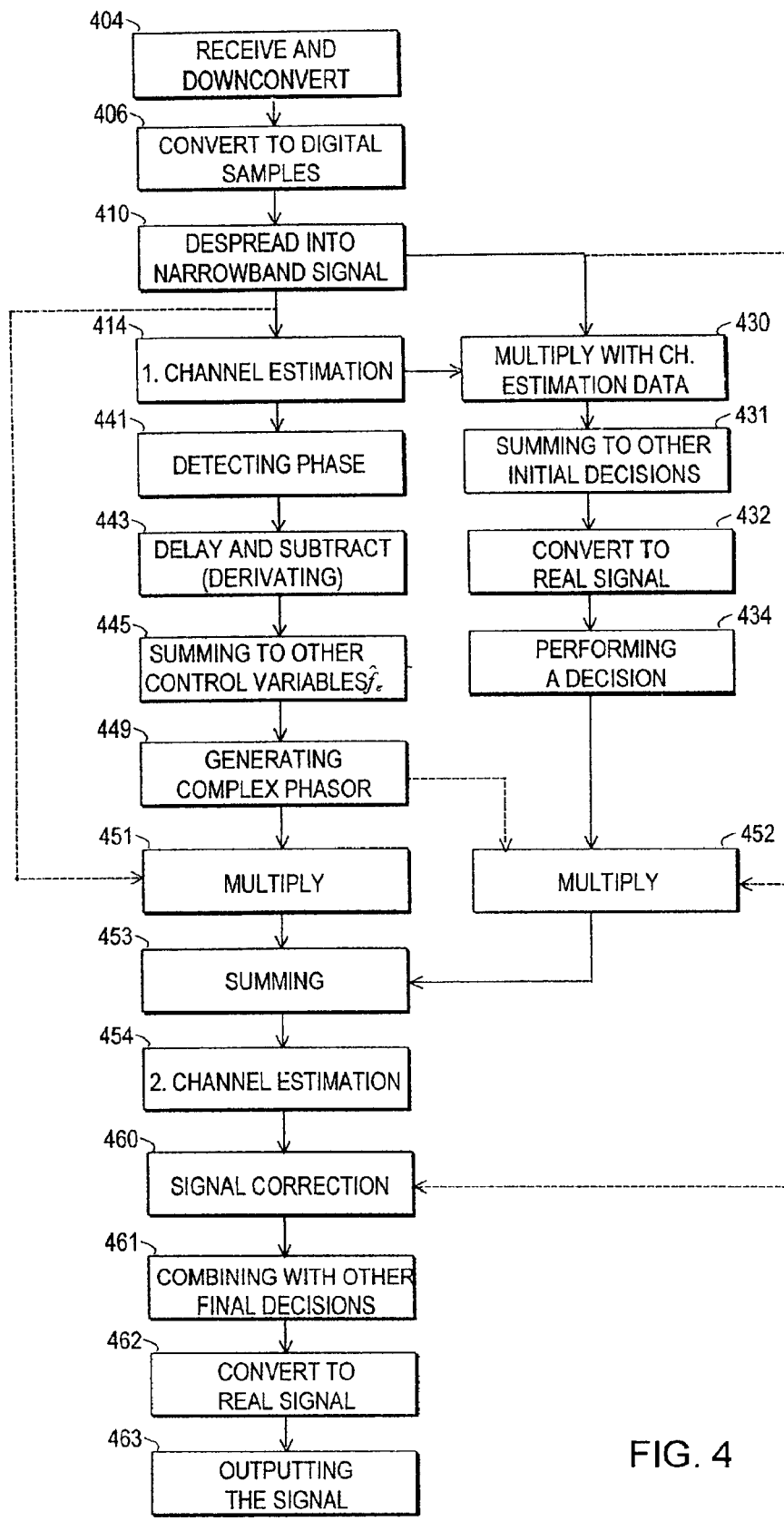
FIG. 4 illustrates a flow diagram of a receiving method according to a further embodiment of the invention.

FIG. 4 illustrates a flow diagram of a receiving method according to another embodiment of the invention where frequency offset correction is performed with a feedforward signal. A received RF signal is first downconverted to the baseband by mixing with a local oscillator (LO) signal, 404, and then converted to digital samples forming a digital baseband signal, 406. The signal is further despread to form a narrowband signal, 410. The despreading is performed successively with a complex conjugate of the long code and the short code.

A first channel estimate is formed on the basis of the signal which is despread with the long code, using the pilot, 414. The channel estimation data is used for performing the channel correction to the information signal that achieved by despreading with both the long and short codes, by multiplication 430. Initial decisions from other fingers is summed to the signal, 431, and the data is then converted into a real signal, 432, and a decision is made, 434. This decision is used for performing a second channel estimate.

The first channel estimate data is, according to the present invention, used for forming the frequency offset correction signal. The phase of the first channel estimate correction data is first detected, 441. The detected phase data is then derivated by, for example, calculating the difference between two consecutive phases. The derivative signal is in this case not integrated, because the correction signal is not used in a feedback loop. The achieved signal is added with frequency offset control variables $\hat{f}_e$ from other rake fingers in order to form an average value for the control variable, and low pass filtered, 445. A complex phasor for the frequency offset correction is formed on the basis of the average control variable, 449.

The frequency offset correction is made by multiplication with the complex phasor for the narrowband signal that is despread by the long code, 451 and for the narrowband signal that is despread by the long code and the short code, 452. After the multiplication, the signals are summed, 453, and further used for calculating a second channel estimate with the pilot, 454. The second channel estimation data now includes the frequency offset correction phasor, so both the phase and frequency correction is made for the despread information signal by multiplying with the second channel estimate data, 460, the achieved signal is further averaged with the final decicions from other fingers, 461, and the signal is converted into a real signal, 462, for forming an output signal of the receiver, 463.

In the method of FIG. 4 the step of derivating may also be performed before the phase detection, which would reduce the number of necessary arctangent calculations in the phase detection.

Figure 5:
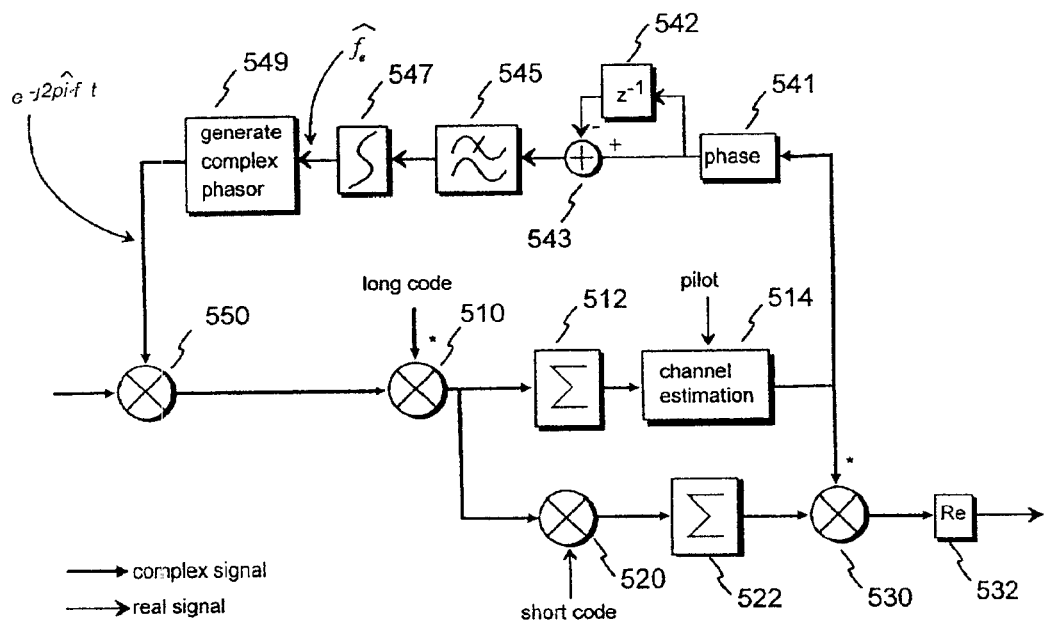
FIG. 5 illustrates an arrangement according to a first embodiment of the invention with feedback frequency correction.

FIG. 5 illustrates an arrangement according to a first embodiment of the invention where feedback correction of frequency offset is made to the wideband signal. The radio frequency parts and the conversion of the baseband signal into digital signal is not shown in FIG. 5, as they can be similar to the prior art arrangement shown in FIG. 1. The digital, baseband samples are led to first a multiplier 550 for mixing with a complex phasor for compensating the frequency offset of the signal, and further to the second multiplier 510. The second multiplier removes the long code by multiplying by the complex conjugate of the long code (symbol * stands for a complex conjugate). The signal is then led to two signal branches In the first signal branch the signal is summed, 512, and further led to a channel estimator, which forms a channel correction estimate signal. In the second branch the signal is multiplied with the appropriate short code of the channel, 520 and summed, 522. Output of summer 522 is multiplied, 530, by the complex conjugate of the channel estimate, and the complex signal is converted into a real signal in the converter 532. The described signal processing blocks 510–532 and their coupling is thus similar to the prior art arrangement of FIG. 1.

The output of the channel estimator is also led to a phase detector 541 which detects the phase of the output correction signal of the channel estimator 514. The detected phase signals are then led to a circuit 542, 543, where differential, ie. derivative, of two successive phase samples is formed. The derivative signal is then led to a low pass filter 545, and the filtered signal is further led to an integrator 547. The complex phasor generator 549 creates a complex phasor, the phase velocity of which is proportional to the filtered and integrated phase derivative. The frequency compensation is then achieved by multiplying the wideband signal with the complex phasor in the multiplier 550 before the despreading.

Figure 6:
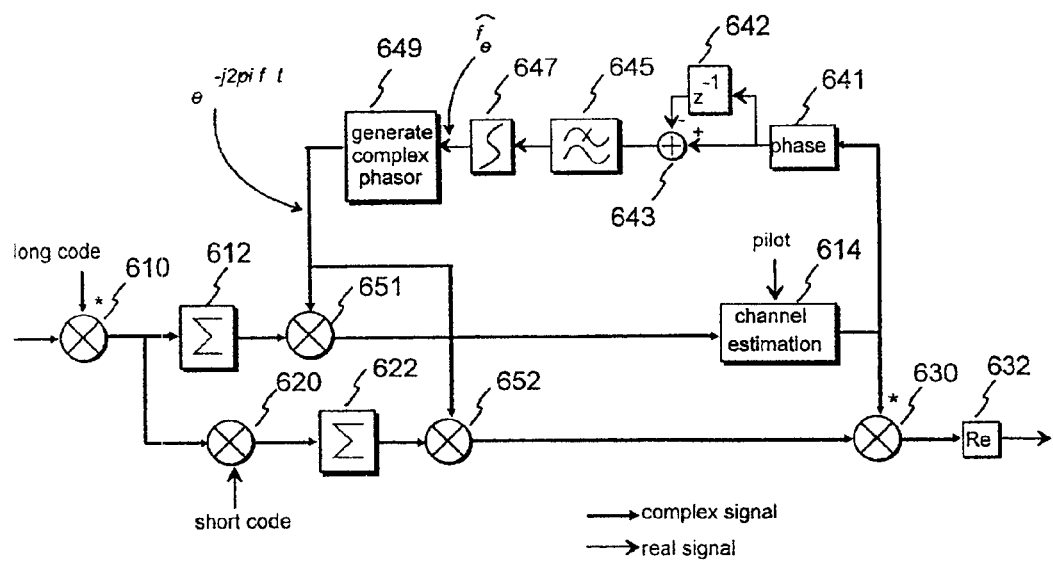
FIG. 6 illustrates an arrangement according to a second embodiment of the invention with feedback frequency correction.

FIG. 6 illustrates an arrangement according to a second embodiment of the invention where feedback correction of the frequency offset is made for a narrowband signal. Corresponding to the arrangement of FIG. 5, it comprises blocks for multiplying the baseband signal with the appropriate long code 610 and the appropriate short code 620, summing blocks 612 and 622 in the two signal branches, channel estimator 614, a multiplier 630 for multiplying the signals from the two branches and a converter 632 for forming a real signal from the output of the multiplier 630.

The arrangement of FIG. 6 also comprises a feedback branch with a phase detector 641, a derivator 642, 643, a low pass filter 645, an integrator 647 and a complex phasor generator 649 for forming a complex phasor for the frequency offset compensation.

In the arrangement of FIG. 6 the compensation with the complex phasor is, however, applied to the narrowband signal after despreading. The arrangement therefore comprises two multipliers for the frequency offset compensation; a multiplier 651 for compensating the despread signal of the first branch, and a multiplier 652 for compensating the despread signal of the second branch. The multiplers are connected to the outputs of the adders 612 and 622, and the same complex phasor signal from the complex phasor generator is applied to the both multipliers 651 and 652.

In the arrangement of FIGS. 5 and 6 the differentiator and lowpass filtering could also be implemented before the phase calculation. This would reduce the number of the necessary arctangent calculations in the phase-block.

One should also note that FIGS. 5 and 6 show just one finger, in a rake receiver there are usually several rake fingers.

Figure 7A:
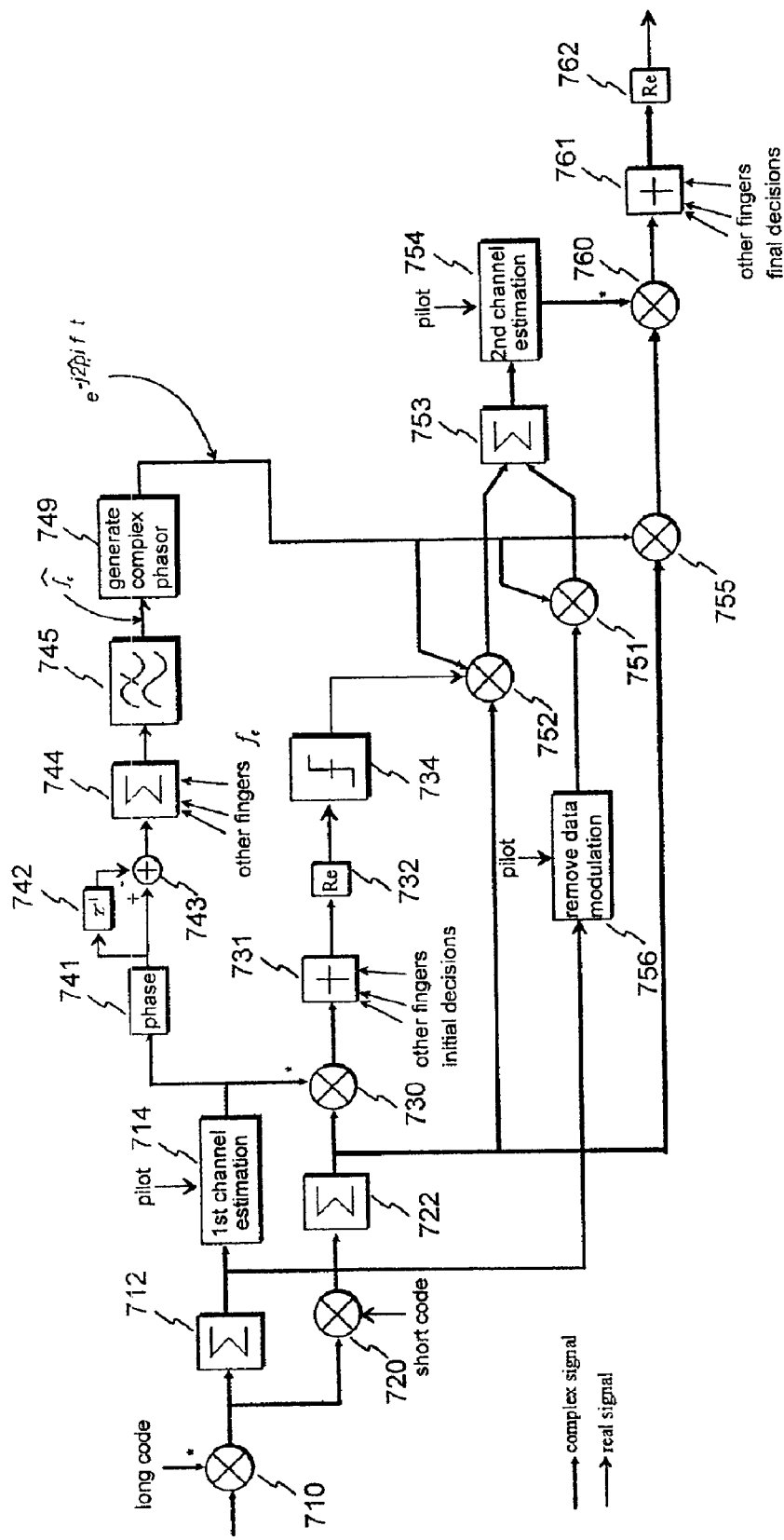
FIG. 7a illustrates an arrangement according to a third embodiment of the invention where feedforward frequency correction is used.

FIG. 7a illustrates a rake receiver arrangement according to a further embodiment of the invention with a feedforward correction of the frequency offset. Corresponding to the previous arrangements the arrangement of FIG. 7a comprises blocks for multiplying the baseband signal with the appropriate long code 710 and the appropriate short code 720, and summing blocks 712 and 722 in the two signal branches. A first channel estimator 714 forms an initial channel estimation data, and the multiplier 730 multiplies the signals from the two branches in order to form a phase corrected information signal forming an initial decision.

The arrangement of FIG. 7a comprises a feedforward branch with a phase detector 741, a derivator 742, 743, and a complex phasor generator 749 for forming a complex phasor for the frequency offset compensation. Since this signal line is part of a feedforward branch, no integrator is required in this signal line.

This initial decision from 730 is combined with initial decisions from other fingers of the rake receiver with eg. maximum ratio combining (MRC), 731, and a converter 732 forms a real signal, according to which a hard decision is made, 734. The data signal is multiplied with the hard decision, 752, which removes the data modulation from the signal if the hard decision is correct. The signal is also multiplied with the complex phasor, 752, which removes the frequency error from the signal, and the resulting signal then only consists of channel information and noise.

From the control channel the data demodulation is removed by using the known pilot bits, 756. The frequency error is then corrected by multiplying by the complex phasor, 751, and the resulting signal then only consists of the channel and noise. The achieved signals from the data and control channels are then summed, 753, in order to improve the signal-to-noise ratio. The signal is further filtered by the second channel estimator, 754, which attenuates the noise power. The data signal from 722 is frequency corrected by multiplying with the complex phasor, 755, and multiplied, 760, by a complex conjugate of of the channel estimates that are received from the second channel estimator.

The corrected signal is combined with final decisions from the other fingers of the rake receiver, and the signal is further led to a converter 762 for forming a real output signal.

Figure 7B:
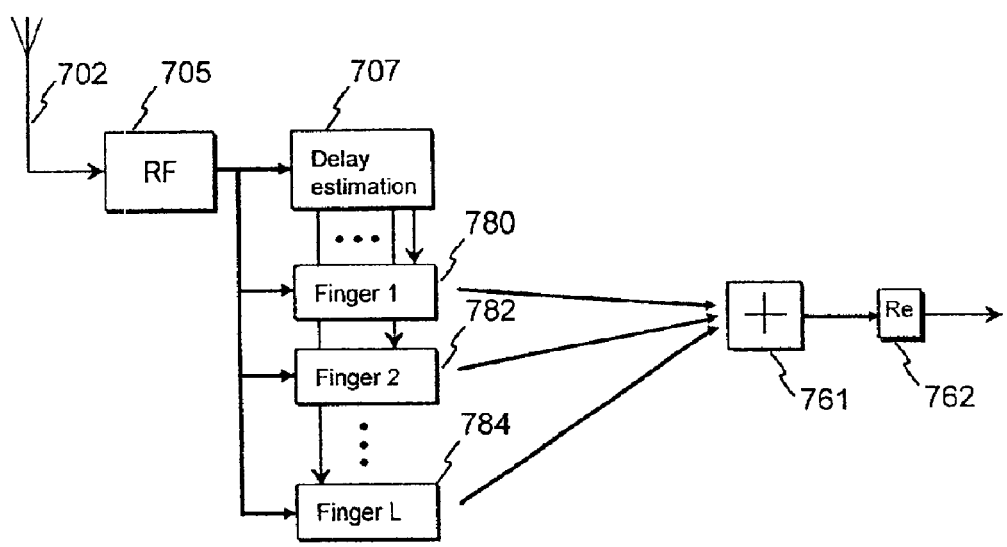
FIG. 7b illustrates an arrangement according to a third embodiment of the invention showing the coupling of the rake fingers.

FIG. 7a shows only one finger of the rake receiver; the receiver also comprises similar receiver circuits for other rake fingers. FIG. 7b illustrates a rake receiver showing the L rake fingers, 780–784. The rake fingers receive the same signal from the RF block 705 which receives the spread spectrum signal from the antenna 702. A delay estimation block 707 estimates the delays of L most significant multipath components, and gives the delay information of each signal component for the corresponding rake finger. The processed multipath components from the rake fingers are then combined by eg. maximum ratio combining (MRC) in block 761, and further converted into a real signal, 762.

Figure 8:
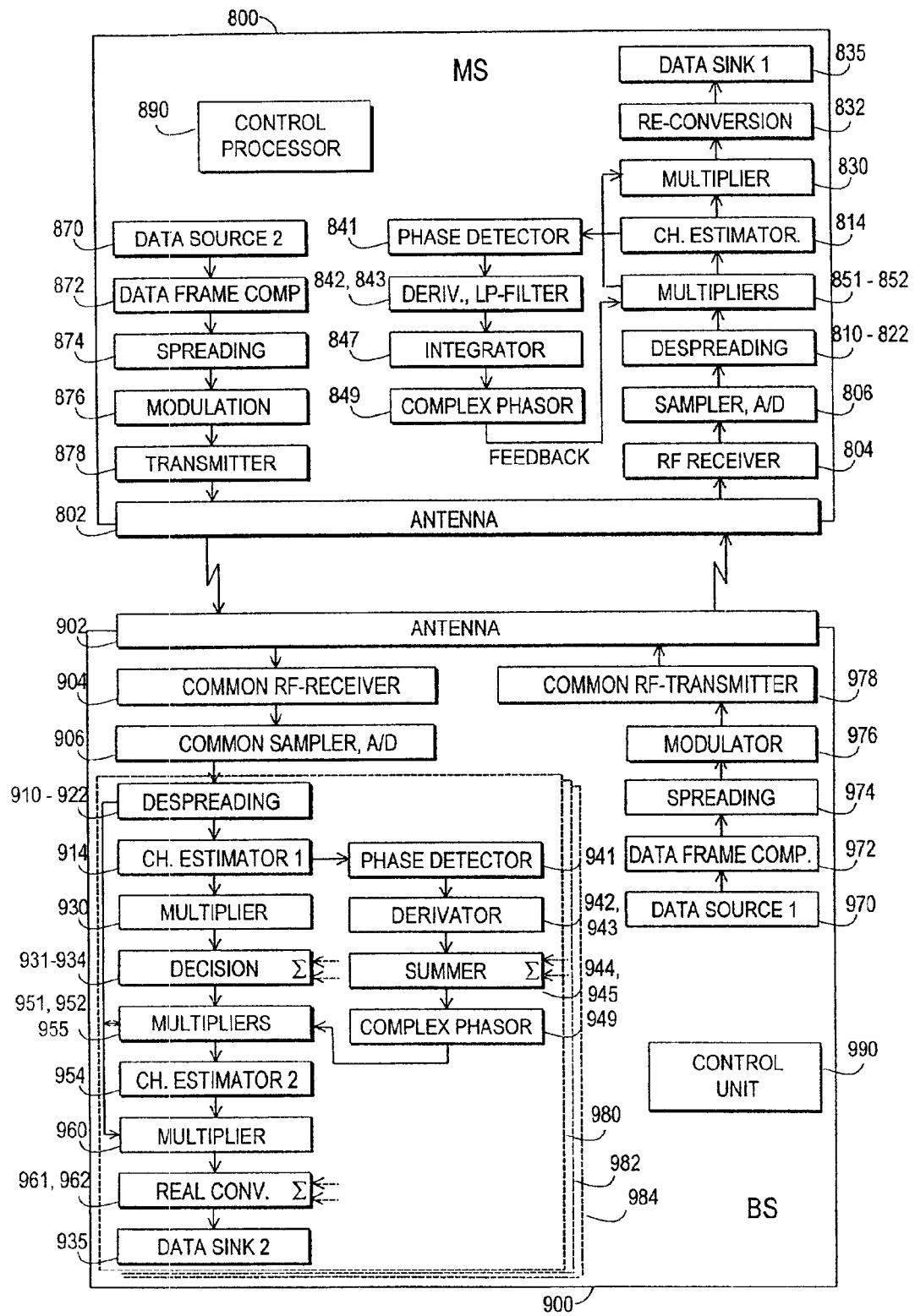
FIG. 8 illustrates an example of a mobile terminal and a base station according the invention.

FIG. 8 illustrates examples of a mobile station (MS) 800 and a base station (BS) 900 of a CDMA mobile communication system according to the invention. A base station of a mobile communication system is generally connected to Base Station Controllers (BSC) or Radio Network Controllers (RNC) which are further connected to a core network that consists of Mobile services Switching Centres (MSC) and other network elements. A mobile communication system usually also has access to other mobile communication systems and Public Switched Telephone Networks (PSTN). These connections and elements are not shown in FIG. 8.

In FIG. 8 the receiver of the mobile station is implemented with a feedback loop that makes the frequency offset correction to the narrow-band signal. The receiver of the base station is implemented with a rake receiver that has a feedforward frequency offset correction. In FIG. 8 both the base station and the mobile station are thus implemented with a receiver according to the invention. Of course, it is also possible that, for example, the base station is implemented with a receiver according to the invention, but some or all of the mobile stations are implemented with other means for adjusting the oscillator frequency such as the AFC (Automatic Frequency Control). In the AFC function the mobile station adjusts its transmission frequency on the basis of received frequency.

The mobile station 800 comprises an antenna 802 for receiving an RF signal from a base station and for transmitting an RF signal to one or several base stations. A received RF signal is downconverted to the baseband in the RF receiver 804 and the baseband signal is further converted into digital samples, 806. The digital processing part of the receiver has basicly the same components as the receiver arrangement that is illustrated in FIG. 6. The wideband signal is despread into a narrowband signal in despreading and summing blocks, 810–822, and the frequency offset correction is performed in multipliers 851, 852 by multiplying with a complex phasor signal. The first branch of the frequency corrected signals is led to the channel estimator 814, and the second branch is led to the multiplier 830 for multiplication with the channel estimator output. The signal is further converted into a real signal for further processing or storing in a data sink 1,835.

The feedback loop comprises a phase detector 841 for detecting the phase of the channel estimator 814 output, a derivator and a low pass filter, 842, 843, an integrator 847 and a complex phasor generator 849.

The transmitter of the mobile station comprises a data source 870, which may include strored data, speech data etc. for transmission. Frames of data are composed, 872, and the data is spread, 876. The wideband signal is further upconverted to the carrier frequency in a modulator 876, and amplified in an RF transmitter 878 for transmission to the base station via the antenna 802. The transmitter of the mobile station mainly corresponds to a prior art transmitter, but the frequency correction procedure of the inventive receiver part may be used for achieving the correct frequency for the transmission.

The mobile station 800 also comprises a control processor 890 for controlling the parts of the receiver and transmitter in the manner described above. The control processor also has an access to memory/memories where control programs. parameters and data to be processed are stored.

The base station 900 comprises an antenna 902 for receiving an RF signal from mobile stations and for transmitting RF signals to mobile stations. A received RF signal is downconverted to the baseband in the RF receiver 904 and the baseband signal is further converted into digital samples, 906. These blocks are common for receiving signals on a determined frequency band.

The digital baseband processing part of the receiver comprises several rake fingers 980–984. They have basicly the same components as the receiver arrangement that is illustrated in FIG. 7. The wideband signal is despread into a narrowband signal in despreading and summing blocks, 910–922. A first channel estimator 914 forms an initial channel estimation data, and the multiplier 930 multiplies the signals from the two branches, and hard decisions are formed, 931–934, using the initial decisions also from other rake receivers 982, 984.

The arrangement comprises a feedforward branch with a phase detector 941 and a derivator 942, 943, for forming a frequency offset estimate. Average of the frequency estimates from all fingers is formed and low pass filtered, 944, 945, and the filtered average signal $\hat{f}_e$ is led to a complex phasor generator 949 for forming a complex phasor for the frequency offset correction.

The complex phasor is used for forming the frequency offset correction in the multipliers 951, 952, 955 which receive the despread signal from the summers 912, 922, and the hard decision, as shown in detail in FIG. 7. The corrected signals from the multipliers 951, 952 are summed and a new channel estimate is made on the basis of the sum signal in the second channel estimator 954.

The second channel estimator 954 is used for correcting the despread data signal that is received from the summer 922 and frequency corrected in the multiplier 955. The channel correction is performed in the multiplier 960, and the corrected signal is averaged with final decisions from the other rake fingers, and converted into a real output signal, 961, 962. The real signal is then further processed or stored in a second data sink, 935.

The transmitter of the base station comprises a data source 970, which may include strored data, speech data etc. for transmission. Frames of data are composed 972, and the data of the bursts is spread, 976. The wideband signal is further upconverted to the carrier frequency in a modulator 976, and amplified in an RF transmitter 978 for transmission to mobile stations via the antenna 902. The RF transmitter may be common for all the RF channels. The transmitter of the base station mainly corresponds to a prior art transmitter, but the channel estimates from the inventive receiver part may be used for determining e.g. a required transmission power for the RF transmission.

The base station 900 also comprises a control processor 990 for controlling the parts of the receiver and transmitter in the manner described above. The control processor also has an access to memory/memories where control programs, parameters and data to be processed are stored.

In general, the processing of information in a telecommunication device, such as a mobile station or a base station, takes place in an arrangement of processing capacity in the form of microprocessor(s) and memory in the form of memory circuits. Such arrangements are known as such from the technology of mobile stations and fixed network elements. To convert a known telecommunication device into a telecommunication device according to the invention, it is necessary to store into the memory means a set of machine-readable instructions that instruct the microprocessor(s) to perform the operations described above. Composing and storing into memory of such instructions involves known technology which, when combined with the teachings of this patent application, is within the capabilities of a person skilled in the art.

The above-described exemplary embodiments of the invention should not be construed as placing limitations to the scope of applicability of the appended claims. Especially the certain additional features that are disclosed as further developments of the basic invention are not mutually exclusive but can be combined in a multitude of ways.

For example, even if the described embodiments concern CDMA/WCDMA receivers, the invention can also be applied in other types of receivers, such as TDMA receivers.

What is claimed is:

1. A method for compensating a frequency offset in processing a received radio signal, wherein the receiving and the processing comprises:

(a) receiving a radio signal having a carrier frequency from a radio channel, (b) producing a local oscillator signal, wherein there is a frequency offset between the carrier frequency of the received radio signal and the frequency of the local oscillator signal, (c) mixing the received radio signal with the local oscillator signal for producing a baseband signal, (d) converting the baseband signal into digital samples, (e) producing a radio channel estimation data, (f) correcting the phase of the baseband signal on the basis of the channel estimation data, (g) detecting phases from successive channel estimation data, (h) generating a complex phasor on the basis of said detected phases, (i) multiplying the baseband signal with said complex phasor for reducing the frequency offset of the baseband signal (j) producing a first channel estimation data, (k) detecting phases from successive first channel estimation data, (l) generating a complex phasor on the basis of said detected phases from successive first channel estimation data, (m) multiplying the baseband signal with the complex phasor for correcting the frequency offset, (n) producing a second channel estimation data on the basis of the frequency corrected signal, and (o) multiplying an uncorrected baseband signal with the second channel estimate data for forming a corrected output signal.

2. A method according to claim 1, characterized in that the received signal is a spread spectrum signal and the method further comprises the step of despreading the received wideband signal to form a narrowband signal.

3. A method according to claim 2, characterized in that the step of multiplying the baseband signal with said complex phasor is performed to the wideband signal prior to despreading.

4. A method according to claim 2, characterized in that the received signal is a spread spectrum signal and the step of multiplying the baseband signal with said complex phasor is performed to the narrowband signal after despreading.

5. A method according to claim 1, characterized in that the radio channel estimate data is made on the basis of the baseband signal that has been multiplied with a complex phasor for frequency offset correction.

6. A method according to claim 5, characterized in that before the step of detecting phases the method comprises a step of forming a derivative signal on the basis of successive channel estimate data, and a step of low pass filtering the derivated data.

7. A method according to claim 5, characterized in that the after the step of detecting phases the method comprises a step of forming a phase derivative signal on the basis of successive detected phase values, and a step of low pass filtering the derivated data.

8. A method according to claim 5, characterized in that before the step of generating a complex phasor on the basis of said detected phases the method further comprises a step of integrating.

9. A method according to claim 1, characterized in that the after the step of detecting phases the method comprises a step of forming a phase derivative signal on the basis of successive detected phase values.

10. A method according to claim 1, characterized in that the before the step of detecting phases the method comprises a step of forming a phase derivative signal on the basis of successive channel estimate data.

11. A method according to claim 1, characterized in that the processing the baseband signal is made for at least two multipath components of the received signal, and the process of reducing the frequency offset is based on averaging at least one signal from the processing of the different multipath components.

12. A method according to claim 11, characterized in that the complex phasor is generated on the basis of frequency offset estimate values from at least two multipath components.

13. An arrangement for receiving a radio signal and compensating a frequency offset in processing the received radio signal, wherein the arrangement comprises:
   (a) means for receiving a radio signal having a carrier frequency from a radio channel,
   (b) means for producing a local oscillator signal, wherein there is a frequency offset between the carrier frequency of the received radio signal and the frequency of the local oscillator signal,
   (c) means for mixing the received radio signal with the local oscillator signal for producing a baseband signal,
   (d) means for converting the baseband signal into digital samples,
   (e) means for producing a radio channel estimation data,
   (f) means for correcting the phase of the baseband signal on the basis of the channel estimation data,
   (g) means for detecting phases from successive channel estimation data,
   (h) means for generating a complex phasor on the basis of said detected phases,
   (i) means for multiplying the baseband signal with said complex phasor for reducing the frequency offset of the baseband signal
   (j) means for producing a first channel estimation data,
   (k) means for detecting phases from successive first channel estimation data,
   (l) means for generating a complex phasor on the basis of said detected phases from successive first channel estimation data,
   (m) means for multiplying the base band signal with the complex phasor for correcting the frequency offset,
   (n) means for producing a second channel estimation data on the basis of the frequency corrected signal, and
   (o) means for multiplying an uncorrected baseband signal with the second channel estimate data for forming a corrected output signal.

14. An arrangement according to claim 13, characterized in that the received signal is a spread spectrum signal and the arrangement further comprises means for despreading the received wideband signal to form a narrowband signal.

15. An arrangement according to claim 14, characterized in that the arrangement comprises means for multiplying a wideband baseband signal with said complex phasor with the output coupled to the input of said despreading means.

16. An arrangement according to claim 14, characterized in that the arrangement comprises means for multiplying a narrowband baseband signal with said complex phasor with the input coupled to the output of the despreading means.

17. An arrangement according to claim 13, characterized in that input of the means for forming the radio channel estimate data is coupled to the output of said means for multiplying the baseband signal with said complex phasor for reducing the frequency offset of the baseband signal.

18. An arrangement according to claim 13, characterized in that it comprises a derivator that is coupled to the output of said channel estimator and a low pass filter which has an input coupled to the output of said derivator and an output coupled to the input of said means for detecting phases.

19. An arrangement according to claim 13, characterized in that it comprises a derivator that is coupled to the output of said means for detecting phases, and a low pass filter which has an input coupled to the output of said derivator and an output coupled to the input of said means for forming a complex phasor.

20. An arrangement according to claim 13, characterized in comprises an integrator for integrating the phase detected data, to form an error frequency value for the input of the means for forming a complex phasor.

21. An arrangement according to claim 13, characterized in that it comprises a derivator for forming a phase derivative signal on the basis of successive detected phase values.

22. An arrangement according to claim 13, characterized in that it comprises a derivator with its input coupled to the output of said channel estimation means and for forming a derivative signal on the channel estimation data prior to detecting phases.

23. An arrangement according to claim 14, characterized in that it comprises at least two rake fingers, and means for averaging at least one corresponding signal from the at least two rake fingers for the process of reducing the frequency offset.

24. A method according to claim 14, characterized in that it comprises means for generating the complex phasor on the basis of frequency offset estimate values (fe) from the at least two rake fingers.

25. A mobile station including an arrangement for receiving a radio signal and compensating a frequency offset in processing the received radio signal, wherein the arrangement comprises:
   (a) means for receiving a radio signal having a carrier frequency from a radio channel,
   (b) means for producing a local oscillator signal, wherein there is a frequency offset between the carrier frequency of the received radio signal and the frequency of the local oscillator signal,
   (c) means for mixing the received radio signal with the local oscillator signal for producing a baseband signal,
   (d) means for converting the baseband signal into digital samples,
   (e) means for producing a radio channel estimation data,
   (f) means for correcting the phase of the baseband signal on the basis of the channel estimation data,
   (g) means for detecting phases from successive channel estimation data,
   (h) means for generating a complex phasor on the basis of said detected phases, and
   (i) means for multiplying the baseband signal with said complex phasor for reducing the frequency offset of the baseband signal,
   (j) means for producing a first channel estimation data,
   (k) means for detecting phases from successive first channel estimation data,
   (l) means for generating a complex phasor on the basis of said detected phases from successive first channel estimation data,
   (m) means for multiplying the baseband signal with the complex phasor for correcting the frequency offset,
   (n) means for producing a second channel estimation data on the basis of the frequency corrected signal, and
   (o) means for multiplying an uncorrected baseband signal with the second channel estimate data for forming a corrected output signal.

26. A base station including an arrangement for receiving a radio signal and compensating a frequency offset in processing the received radio signal, wherein the arrangement comprises:

(a) means for receiving a radio signal having a carrier frequency from a radio channel, (b) means for producing a local oscillator signal, wherein there is a frequency offset between the carrier frequency of the received radio signal and the frequency of the local oscillator signal, (c) means for mixing the received radio signal with the local oscillator signal for producing a baseband signal, (d) means for converting the baseband signal into digital samples, (e) means for producing a radio channel estimation data, (f) means for correcting the phase of the baseband signal on the basis of the channel estimation data, (g) means for detecting phases from successive channel estimation data, (h) means for generating a complex phasor on the basis of said detected phases, and (i) means for multiplying the baseband signal with said complex phasor for reducing the frequency offset of the baseband signal, (j) means for producing a first channel estimation data, (k) means for detecting phases from successive first channel estimation data, (l) means for generating a complex phasor on the basis of said detected phases from successive first channel estimation data, (m) means for multiplying the baseband signal with the complex phasor for correcting the frequency offset, (n) means for producing a second channel estimation data on the basis of the frequency corrected signal, and (o) means for multiplying an uncorrected baseband signal with the second channel estimate data for forming a corrected output signal.

* * * * *